(12) United States Patent  
Minassian et al.

(10) Patent No.: US 9,007,259 B1  
(45) Date of Patent: Apr. 14, 2015

(54) FLIGHT LINE NOISE TESTER

(71) Applicants: Advanced Testing Technologies, Inc., Hauppauge, NY (US); Eli Levi, Dix Hills, NY (US)

(72) Inventors: Shahen Minassian, Dix Hills, NY (US); Richard Engel, Ridge, NY (US); Eli Levi, Dix Hills, NY (US)

(73) Assignee: Advanced Testing Technologies Inc., Hauppauge, NY (US)

( * ) Notice: Subject to any disclaimer, the term of this patent is extended or adjusted under 35 U.S.C. 154(b) by 0 days.

(21) Appl. No.: 14/304,397

(22) Filed: Jun. 13, 2014

(51) Int. Cl.  
*G01S 7/40* (2006.01)

(52) U.S. Cl.  
CPC . *G01S 7/40* (2013.01); *G01S 7/4052* (2013.01)

(58) Field of Classification Search  
CPC .............................. G01R 29/26; G01S 7/4052  
USPC .................................. 342/165–174; 324/613  
See application file for complete search history.

(56) References Cited

U.S. PATENT DOCUMENTS

| | | | |
|---|---|---|---|
| 5,179,344 A * | 1/1993 | Najle et al. ..................... 324/613 |
| 5,412,325 A * | 5/1995 | Meyers .......................... 324/613 |
| 5,910,977 A | 6/1999 | Torregrossa |
| 5,952,834 A * | 9/1999 | Buckley ......................... 324/613 |
| 6,384,488 B1 * | 5/2002 | Bucharelli et al. ............. 307/9.1 |
| 6,397,173 B1 | 5/2002 | Campbell et al. |
| 6,480,006 B1 * | 11/2002 | Buckley ......................... 324/613 |
| 7,680,493 B2 | 3/2010 | Scranton |
| 7,920,830 B2 | 4/2011 | Cheng |
| 8,525,509 B2 | 9/2013 | Shrinkle et al. |
| 2004/0046689 A1 * | 3/2004 | Rees et al. ..................... 342/159 |
| 2005/0250464 A1 * | 11/2005 | Spencer et al. ............... 455/260 |
| 2009/0254292 A1 | 10/2009 | Wegener |
| 2010/0327940 A1 * | 12/2010 | Eisenstadt et al. ............ 327/357 |
| 2012/0003942 A1 | 1/2012 | Grunert et al. |
| 2012/0294347 A1 | 11/2012 | Husted et al. |
| 2014/0119421 A1 | 5/2014 | El-Hassan |

\* cited by examiner

*Primary Examiner* — John B Sotomayor  
*Assistant Examiner* — Marcus Windrich  
(74) *Attorney, Agent, or Firm* — Brian Roffe (57) ABSTRACT

Phase noise analyzing system that analyzes phase noise in radio frequency (RF) signals provided by a device under test when coupled thereto includes a low noise receiver that receives at a first input, signal from the device under test when coupled thereto, a low noise synthesizer that provides output to the receiver, a frequency domain analyzer that receives output from the receiver, a time domain analyzer that receives output from the receiver, a switching system that controls signal flow to and from the receiver, the synthesizer, the frequency domain analyzer and the time domain analyzer, and a computer that controls the switching system to perform the analysis of phase noise in signals provided by the device under test.

23 Claims, 10 Drawing Sheets

FLIGHT LINE NOISE TESTER

FIELD OF THE INVENTION

The present invention relates generally to the testing/screening of radar system components at the flight line level for phase noise performance and to methods and systems that perform absolute, additive, AM, PM, pulsed and direct phase noise measurements of radio frequency (RF) signals.

BACKGROUND OF THE INVENTION

Radar systems with Built-In Test (BIT) target generators typically provide only limited target detection test capability. Excessive phase noise within the Stable Local Oscillator (STALO) of a radar system can significantly impact target detection in pulse Doppler and moving target indicator radars. Once a radar system leaves the factory, it typically is not screened for phase noise ever again. As components within the radar system degrade, they can affect phase noise and overall system performance, often adversely, without exhibiting functional failures or any indication to an operator.

OBJECTS AND SUMMARY OF THE INVENTION

An object of at least one embodiment of the present invention is to provide aircraft maintenance personnel with a test system that permits periodic screening of radar system assemblies for phase noise on the actual aircraft, and importantly, before component degradation significantly affects performance.

A phase noise analyzing system that analyzes phase noise in radio frequency (RF) signals produced by a device under test when coupled thereto in accordance with the invention includes a low noise receiver that receives at a first input, signal from the device under test when coupled thereto, a low noise synthesizer that provides output to the receiver, a frequency domain analyzer that receives output from the receiver, a time domain analyzer that receives output from the receiver, a switching system that controls signal flow to and from the receiver, the synthesizer, the frequency domain analyzer and the time domain analyzer, and a computer that controls the switching system to perform the analysis of phase noise in signals provided by the device under test.

The computer may be a portable computer, in which case, a transportable housing has a first port for connecting to the computer and a second port for connecting to the device under test, and the receiver, the synthesizer, the frequency domain analyzer and the time domain analyzer are situated in or on the housing such that the system is transportable. Also, a power supply maybe arranged in or on the housing and coupled to the receiver, the synthesizer, the frequency domain analyzer and the time domain analyzer to provide power thereto.

Advantageously, for the transportable system, a power supply is arranged in or on the housing and configured to provide power to the device under test when coupled thereto.

A method for analyzing phase noise in signals provided by a device under test in accordance with the invention includes measuring phase noise of a signal from the device under test, setting, using a processor, an initial corrected value for points in the signal to a value (MV) of the measured phase noise and a counter to 1, then computing, using a processor, a corrected value (CV) for each point based on the equation $$CV = MV - 10*\log_{10}\left(1 + 10^{-ABS\left[\frac{REF-CV}{10}\right]}\right)$$

wherein REF is a level of a reference carrier of the low noise synthesizer, and determining factor for each point, using a processor, whether a change between the corrected value and an immediately preceding corrected value is below a threshold or whether the counter is greater than a predetermined number and if so, using the corrected value as an indication of the phase noise of the signal, otherwise incrementing the counter and re-computing the corrected value until the change between the corrected value and an immediately preceding corrected value is below the threshold or the counter is greater than the predetermined number. This may be referred to as software correction for tangential.

Another method for analyzing phase noise in signals provided by a device under test in accordance with the invention includes measuring phase noise of a signal from the device under test using a receiver having a phase lock loop with a voltage controlled crystal oscillator that induces a suppression effect proximate a carrier frequency of the signal, for a frequency range of the signal, determining a polynomial that best fits points of the signal in the frequency range, and increasing the measured phase noise by a line determined by the polynomial fit to correct for the suppression induced by the phase lock loop. This may be referred to as software correction for loop bandwidth correction.

Yet another method for analyzing phase noise in signals provided by a device under test in accordance with the invention includes identifying spurious signals, and excluding points forming a spur in the identified spurious signals by close proximity from limit line evaluation by comparing the points to a limit relating to the device under test. The spurious signals may be identified by identifying data points on a phase noise data curve above a noise floor determined in a preceding regression/statistical analysis.

The invention will be described in detail with reference to some preferred embodiments of the invention illustrated in the figures in the accompanying drawings. However, the invention is not confined to the illustrated and described embodiments alone.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE INVENTION

Minimizing phase noise within a radar system provides a significant challenge to the designers of radar systems. As technology improves, phase noise specifications become more stringent in an effort to increase range detection and accuracy. Accurately measuring phase noise with repeatable results in cutting edge radar systems has proven to be even more of a challenge. Measuring phase noise down to −160 dBc or more involves measurements in the single digit nanovolt (nV) range. In order to achieve measurements down to this range, it is obvious that implementing appropriate shielding/filtering are mandatory and correction factors are necessary. Preferred embodiments of the invention will be described with reference to FIGS. 1-8 wherein like reference numerals refer to the same or similar elements.

Dedicated phase noise measurement systems currently exist but are not always suited to a flight line or back shop environment. Typically, these measurement systems are not user friendly and require a high level of understanding to operate properly. As shown in the block diagram of FIG. 1, control of the invention is handled by a portable laptop computer 10 (which represents a general computer or other processing unit, device or system). In this embodiment, phase noise measurements are under the control of a test program set (TPS) available to be executed by the computer 10, e.g., in a storage media of or available to the computer 10. The TPS consists of a plurality of tests which set up the test paths and parameters and apply a set of limits. Typically, a TPS would be coded by an individual knowledgeable with the equipment and programming syntax. The TPS code is not constrained to any one language or programming environment although in a preferred embodiment, TestBASIC® is used for its ease of use and existing test executive structure which allows rapid development of a TPS. Once the TPS code has been debugged and verified, the TPS can be run by virtually anyone capable of following written and/or graphic connection prompts making it an ideal solution for flight line and back shop personnel.

In a preferred embodiment, the test system is controlled via an Ethernet connection 12 through a network switch 14. Time has proven the Ethernet connection to be a robust interface with more than sufficient throughput for this application. Alternate embodiments may utilize other buses for control (such as, but not limited to: USB, MXI, FireWire, GPIB, Bluetooth or RS232 serial) or employ a plurality of buses as the application requires. In a preferred embodiment, the flight line noise tester comprises four major subsystems: a Low Noise Receiver 16, Low Noise Synthesizer 18, Frequency Domain Analyzer 20 (such as a spectrum analyzer) and Time Domain Analyzer 22 (such as an oscilloscope or digitizer). All of these major subsystems are connected to the network switch 14, and thus available for control in accordance with the TPS being executed by the computer 10 Alternate embodiments may optionally include one or more DC power supplies 24 for sourcing power to the device under test (DUT) 26. This optional feature is represented by the dotted lines in FIG. 1. The DUT 26 is connected to the optional DC power supplies 24, and outputs to the Low Noise Receiver 16. Also, in the additive mode described below, the Low Noise Synthesizer 18 provides output to the DUT 26.

Figure 1:
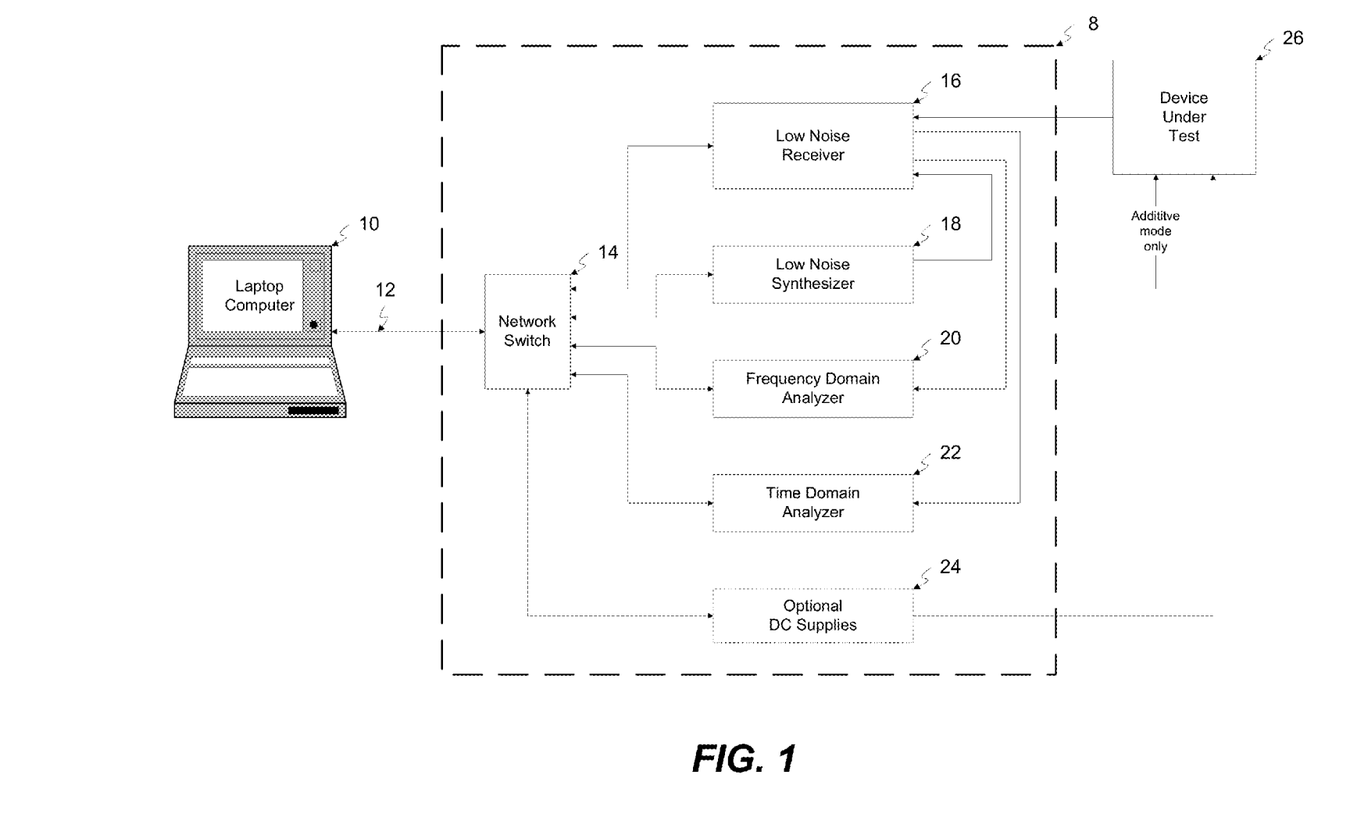
FIG. 1 shows a block diagram of the overall system in accordance with the invention.

To facilitate transportability of the phase noise analysis system, the low noise receiver 16, the low noise synthesizer 18, the frequency domain analyzer 20 and the time domain analyzer 22 may be arranged in or on a transportable housing (represented by the dotted line 8). The optional DC supplies 24 may also be situated in or on this housing 8. The housing 8 includes a first port to enable it to be connected to the computer 10, the Ethernet connection 12 being a wired cable, wireless connection (WiFi) or other electrical connection feature associated with this port. The housing 8 also includes a second port to enable it to be connected to the device under test 26 for signal transfer from the device under test 26 to the low noise receiver 16, as well as a third port to enable the output from the low noise synthesizer to be provided to the device under test 26, i.e., in the additive mode.

The housing 8 also includes a fourth port to enable power from the DC power supplies 24 to be provided to the device under test 26, i.e., to provide power thereto to facilitate the signal output for subsequent analysis. By providing the DC power supplies 24 on the housing 8, the system can be transported to the location of the device under test 26, coupled to the device under test 26 and computer 10 and used for phase noise analysis. This transportability is especially useful since it allows the system to be used for signal producing devices on aircraft.

Figure 2:
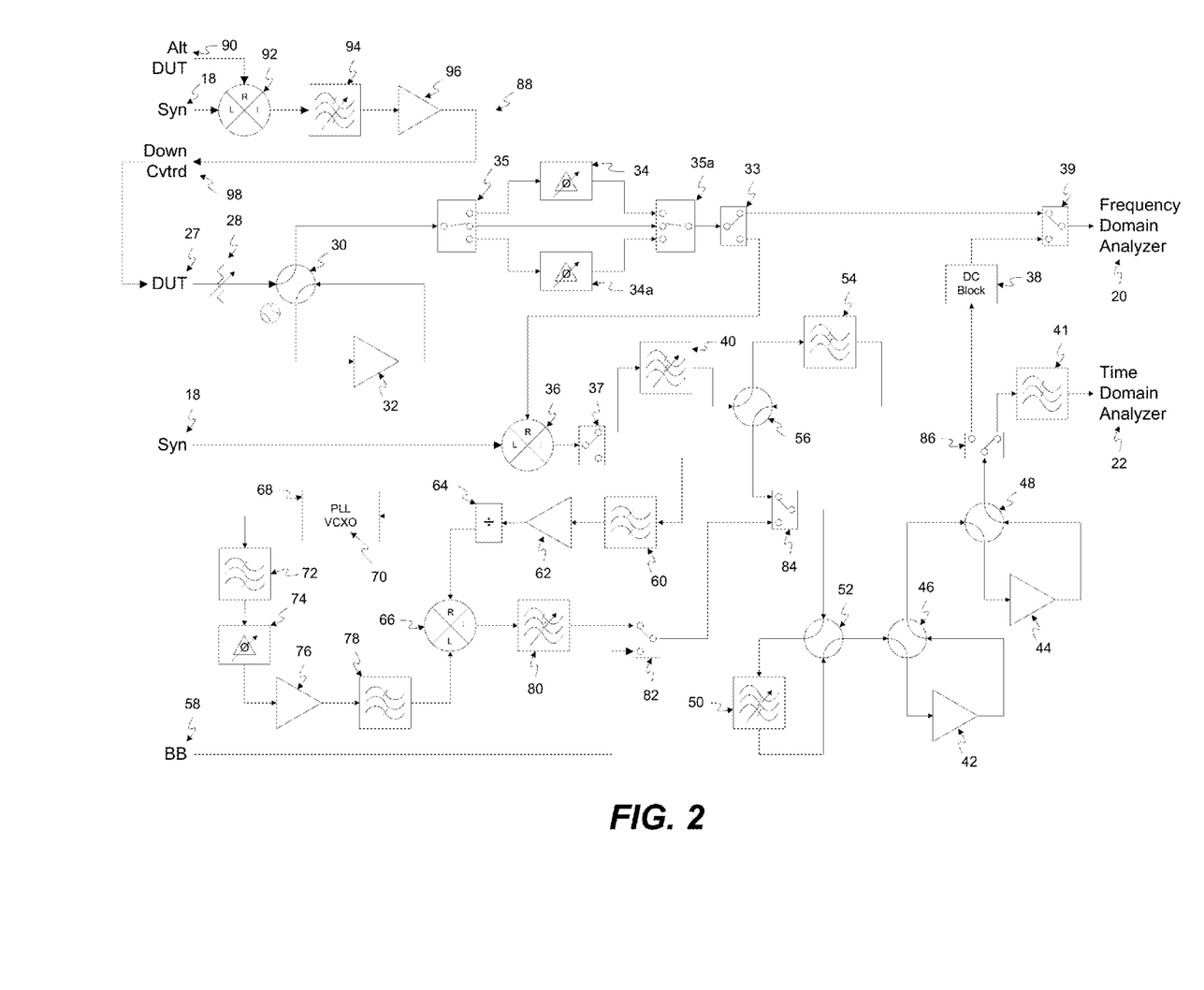
FIG. 2 reflects the receiver portion of the system in further detail.

The Low Noise Receiver 16 reflected in the block diagram of FIG. 1 is depicted in further detail in FIG. 2. The RF Input from the DUT 26 enters the receiver 16 where level conditioning may be optionally applied. The signal applied at the RF Input would typically be routed to the frequency domain analyzer 20 (as shown in the depicted path) for signal identification of frequency and level. The programmable attenuator 28 allows for level reduction of higher power signals and would initially be set for maximum attenuation to prevent overload of the frequency domain analyzer 20 or other components within the receiver 16. Gain can be added to lower level input signals via the low noise amplifier (LNA) 32 when the transfer switch 30 is switched to its opposing position as shown in the dashed inset.

In alternate embodiments of the invention, any transfer switch (for example, a 'baseball' switch) may be implemented using single pole double throw (SPDT) switches in tandem which allows for an isolation position when switches are independently controlled and set in a cross position. The input signal level can be optimally adjusted for phase noise measurement using the attenuator 28 and/or LNA 32. This path also allows for direct spectral analysis of the phase noise on the frequency domain analyzer 20.

The phase noise of an RF assembly that does not contain a signal source can be measured by the proposed invention. This is usually referred to as additive phase noise and utilizes a low phase noise signal (from the Low Noise Synthesizer 18 shown in FIG. 1) fed into the DUT 26 while simultaneously feeding the Syn Input of the receiver 16 as well.

After level conditioning, the DUT signal passes through one of the band-dependent phase shifters 34, 34*a*, via control of switches 35, 35*a*. The synthesizer 18 feeds the 'L' port of a mixer 36 and the phase shifted DUT signal feeds the 'R' port of the mixer 36 with the resultant baseband (BB) signal appearing at the output of the 'I' port of the mixer 36, after passing through switch 33 set in one position. In the other position of switch 33, the signal is directed directly to the frequency domain analyzer 20 via another switch 39. The baseband signal, containing DC+noise, is, after passing through switch 37 set in one position, filtered using a low pass filter 40 with a tunable cutoff frequency (nominally 2, 5 or 10 MHz) and routed directly or indirectly to the time domain analyzer 22. At a minimum, the signal need only pass through a filter 41 before the time domain analyzer 22, but alternatively may pass through other filters and/or amplifiers as described below.

The appropriate phase shifter is iteratively stepped over a minimum of 180° of phase shift to find the settings at which the DC component of the signal exhibits a maximum excursion as well as the minimum (as close to 0.0 $V_{DC}$). Further analysis using the frequency domain analyzer 20 at the phase shift setting corresponding to the maximum DC excursion will yield the additive amplitude modulated (AM) component of the phase noise whereas analysis at the phase shift setting corresponding to the zero DC value will yield the phase modulated (PM) component of the additive phase noise.

To analyze the DC+noise signal for additive phase noise, the signal is routed to the frequency domain analyzer 20 through a DC block 38 and switch 39. The DC block 38 removes any residual DC component of the signal which could artificially skew the measurement values and/or potentially damage the frequency domain analyzer 20.

The noise component must be amplified prior to measurement by the frequency domain analyzer 20. Two low frequency LNA stages 42, 44 may be independently inserted using transfer switches 46, 48, respectively, in a split amplification arrangement. For frequency offset measurements close to the carrier frequency (i.e. <1 kHz), usually only one LNA stage would be used. Using both LNA stages at frequency offsets close in could potentially saturate the amplification resulting in artificially skewed measurement values. For carrier frequency offsets >1 kHz, both LNA stages 42, 44 would typically be used.

A baseband signal containing high spurious content resulting from the AC line frequency can also saturate the LNA stage(s) 42, 44 and artificially skew measurement values.

The present invention incorporates a tunable highpass filter 50 which may be inserted prior to the LNA stages 42, 44 by means of a switch 52 to sufficiently reduce the line spurious content to prevent saturation of the LNA stages 42, 44 resulting in a measurement that accurately reflects the additive phase noise of the DUT 26. The present invention also includes a pulse repetition frequency (PRF) filter 54 which can be inserted into the baseband path by means of a switch 56 to permit additive phase noise measurements on DUTs that operate under pulsed RF conditions. A direct BB input 58 allows baseband signals to be measured directly and may also be used for gain calibration of the LNA stages 42, 44.

The phase noise of an RF assembly that contains a signal source can be measured by a system and method of the invention. This is usually referred to as absolute phase noise and utilizes a low phase noise signal (from the Low Noise Synthesizer 18 shown in FIG. 1) fed into the Syn Input of the receiver 16 which is tuned at a nominal 10 MHz offset from the DUT carrier frequency.

After level conditioning, the DUT signal passes directly to the 'R' port of the mixer 36 along with the synthesizer on the 'L' port of the mixer 36, resulting in a 10 MHz nominal difference frequency at the 'I' port of the mixer 36. After passing through switch 37 set in one position, the difference frequency is bandpass filtered by filter 60, amplified by amplifier 62 and split two ways by a signal splitter 64; one side of the split is feed to the 'R' port of the next mixer 66, and the other side feeds into a phase lock loop (PLL) voltage controlled crystal oscillator (VCXO) module 68. Switch 37 therefore selectively switches the output from the mixer 36 to the filter 60 or to the filter 40.

The use of a phase locked crystal oscillator 70 in the PLL VCXO module 68 allows the invention to track variations in DUT carrier frequency of up to about ±22 kHz from the nominal 10 MHz VCXO frequency. In a preferred embodiment of the invention, the 10 MHz PLL VCXO module bandwidth is selectable to permit 100 Hz, 750 Hz, 1500 Hz and open loop bandwidths which allows for different DUT carrier frequency stabilities. The 10 MHz VCXO phase locks to the difference frequency of the mixer 36, is bandpass filtered by filter 72 and fed through a phase shifter 74. The phase shifted 10 MHz VCXO signal is amplified by amplifier 76 and filtered again, by filter 78, and fed to the 'L' port of the next mixer 66.

The resultant baseband (BB) signal appearing at the output of the 'I' port of mixer 66 contains DC+noise, is filtered using a low pass filter 80 with a tunable cutoff frequency (nominally 2, 5 or 10 MHz) and routed to the time domain analyzer 22. The routing is dependent on the position of switches 82, 84, 86 and switches 46, 48, 52.

For absolute phase noise, the baseband phase shifter 74 is iteratively stepped over a minimum of 180° of phase shift to find the settings at which the DC component of the signal exhibits a maximum excursion as well as the minimum (as close to 0.0 $V_{DC}$). Further analysis using the frequency domain analyzer 20 at the phase shift setting corresponding to the maximum DC excursion will yield the absolute amplitude modulated (AM) component of the phase noise whereas analysis at the phase shift setting corresponding to the zero DC value will yield the absolute phase modulated (PM) component of the phase noise. Analysis of the absolute DC+noise signal is the same procedure as the additive phase noise and therefore shares a common measurement path. Use of the split baseband LNA stages 42, 44 and bandpass filter 50 for spurious reduction is identical to that of the additive phase noise measurement.

A preferred embodiment of the invention also includes a downconversion stage 88 that allows signals beyond the frequency range of the phase shifters 34, 34a used for analyzing additive phase noise. In this embodiment, the DUT signal is fed into the 'Alt DUT' connection 90 of housing 8 and applied to the 'R' port of a wideband mixer 92. One of the outputs of the low phase noise synthesizer 18 is used to feed the 'L' port of the mixer 92, with the resulting downconverted signal appearing on the 'I' port of the mixer 92. This signal passes through a bandpass filter 94 which is tuned to the desired high-side or low-side mix frequency. This signal is then amplified by amplifier 96 and passed out through the 'Down Cvtrd' connection 98 for external connection to the DUT' connection 27 of housing 8 for additive or absolute phase noise analysis as previously described.

Figure 3:
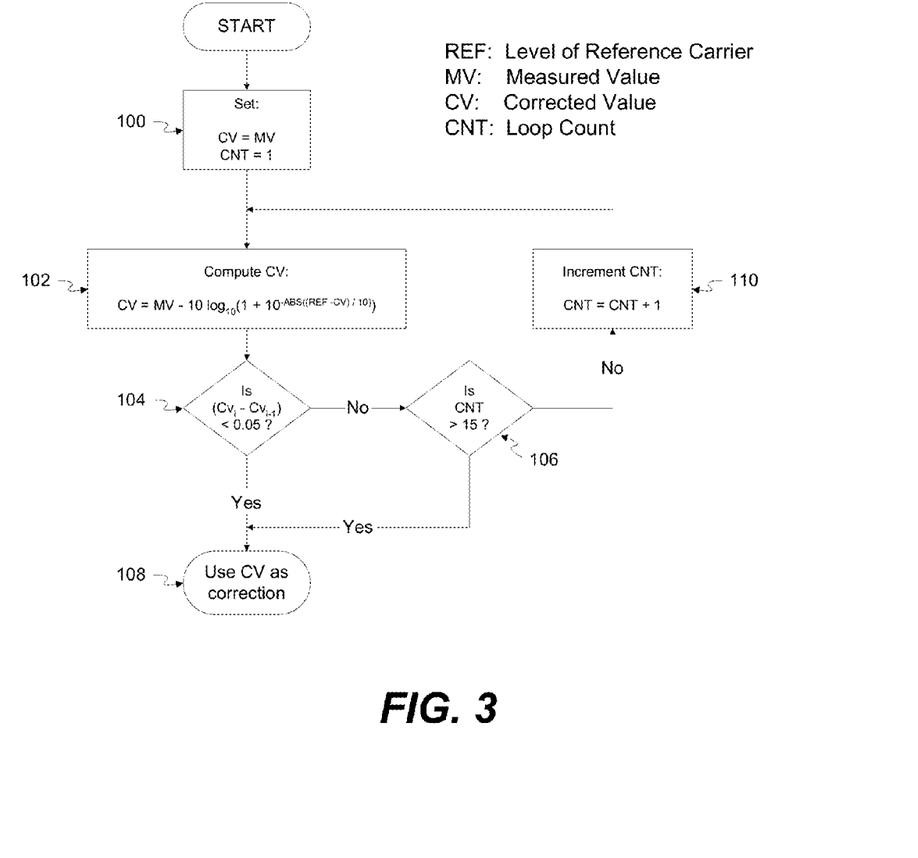
FIG. 3 details a tangential correction algorithm.

In a preferred embodiment, the invention applies additional tangential correction to a measured signal value as per the algorithm shown in FIG. 3. In this algorithm, the initial corrected value is set to the measured value (100) with an initial loop count of 1. The corrected value is iteratively computed (102) per the equation:

$$CV = MV - 10 * \log_{10}\left(1 + 10^{-ABS\left[\frac{REF-CV}{10}\right]}\right)$$

until either exit condition (104, 106) is satisfied to provide the corrected value as the correction; if neither exit condition is satisfied the loop count is incremented (110) and the sequence repeats. One exit condition (104) is whether the difference between the current corrected value $Cv_i$ and the immediately preceding corrected value $Cv_{i-1}$ is less than 0.05, and the other exit condition (106) is whether the count is greater than 15. The algorithm in FIG. 3 provides a software correction for tangential CV (108) on a point-by-point basis.

The additional tangential correction provided by the algorithm in FIG. 3 is exemplary only. It may not be applied in all embodiments of the invention, and alternative additional tangential correction algorithms may be alternatively or additionally applied in the invention.

The baseband phase lock loop allows for the tracking of time varying carrier frequencies but also has a suppression effect at low carrier offset frequencies which is more pronounced at the higher loop bandwidths. In order to achieve an accurate phase noise measurement close in to the carrier, correction for the different loop bandwidths must be applied; without correction, close in phase noise appears lower than it actually is resulting in better than expected results.

Figure 4:
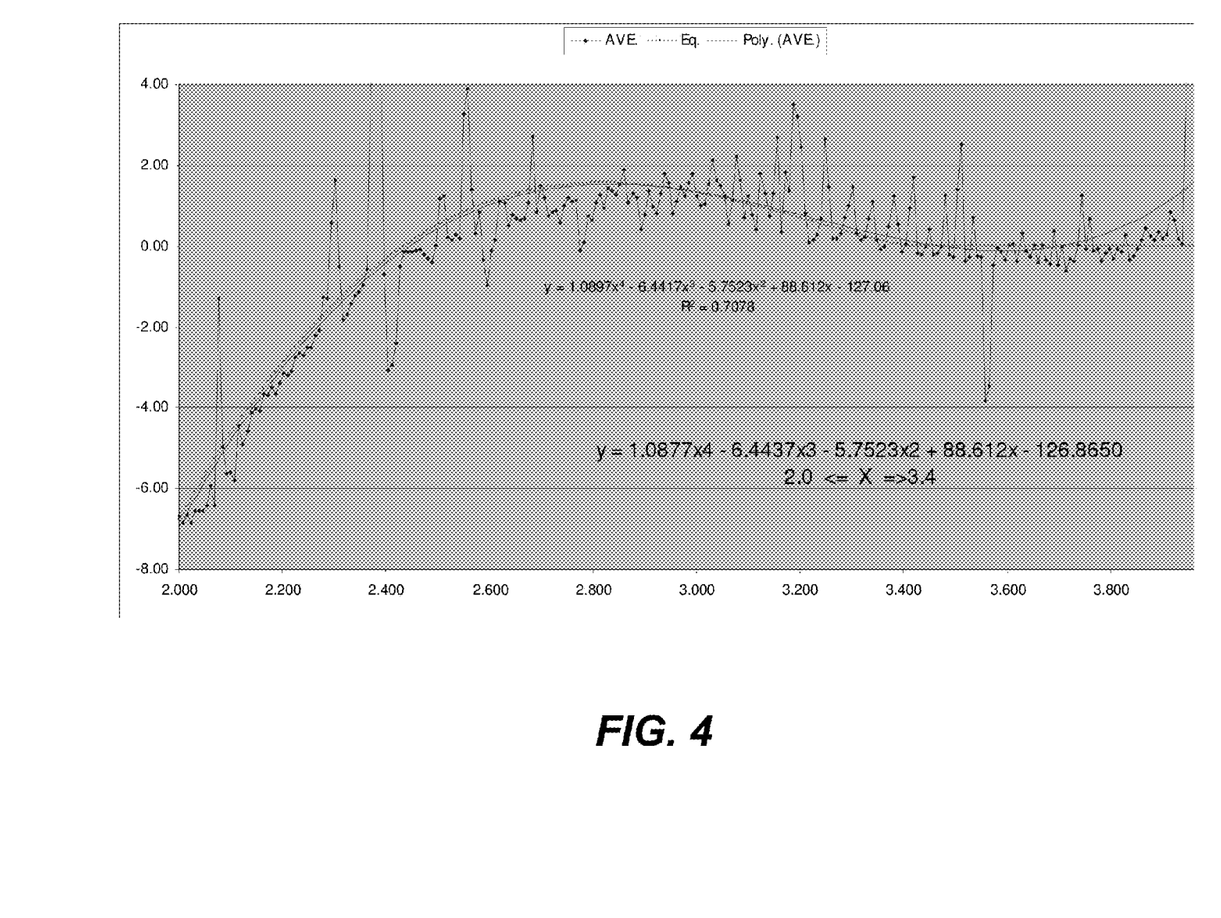
FIG. 4 represents a loop suppression correction with polynomial fit at 100 Hz PLL loop bandwidth.
Figure 5:
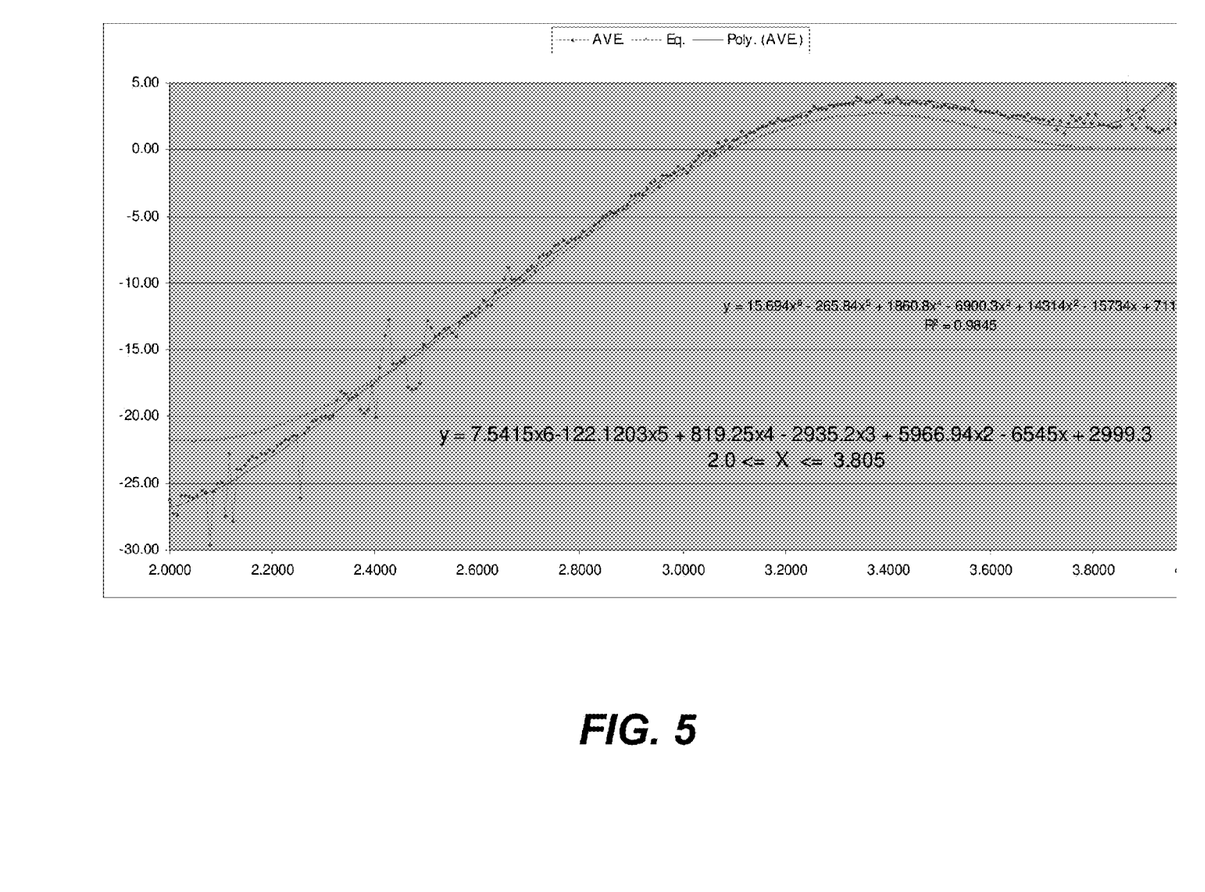
FIG. 5 represents a loop suppression correction with polynomial fit at 750 Hz PLL loop bandwidth.
Figure 6:
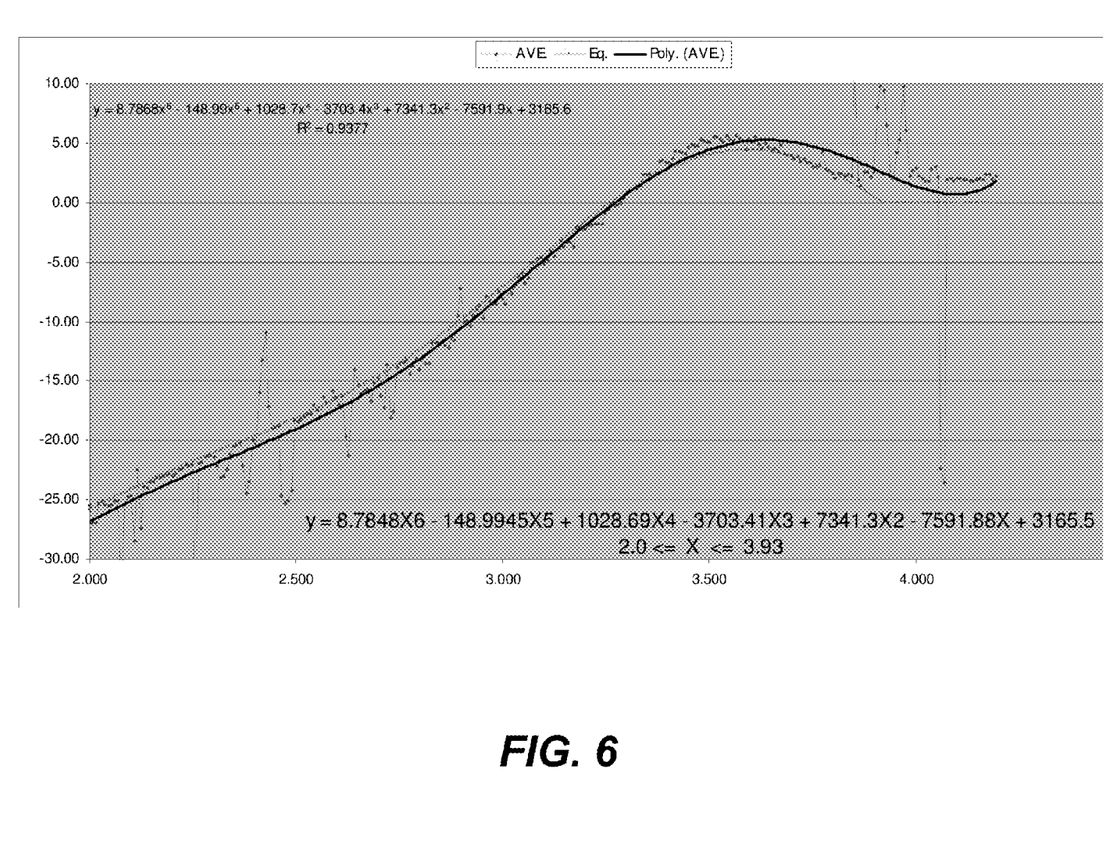
FIG. 6 represents a loop suppression correction with polynomial fit at 1500 Hz PLL loop bandwidth.

Proper correction for the loop bandwidth of the phase lock loop used in the absolute mode may be achieved through, for example, the use of polynomial curve fitting. The PLL suppression of the baseband signal was characterized at the specified loop bandwidths across a plurality of different types of carrier sources and compared against the open loop bandwidth setting. The aggregate data was then curve fit and a polynomial function representing the data over the applicable frequency range was generated. FIG. 4 (100 Hz loop bandwidth), FIG. 5 (750 Hz loop bandwidth) and FIG. 6 (1500 Hz loop bandwidth) are representative of the data taken where the x-axis is the logarithm of the frequency offset in Hertz and the y-axis is the amplitude in dB.

Regarding providing a software correction for loop bandwidth suppression, the phase lock loop (PLL) suppresses the phase noise close in to the carrier. The PLL is characterized using several different types of RF sources averaged together using an independent phase noise measurement system to establish the characteristics of the PLL design. Ideally, the response should be flat at 0.0 dB amplitude (y-axis). Note that the x-axis is frequency in logarithmic terms (i.e., from FIG. 4, 2.0=10^2=100 Hz; 3.4=10^3.4=2512 Hz). Since the line is not flat, the line dictated by the polynomial equation is subtracted from the measured data to correct for suppression within the specified limits.

Phase noise measurements typically involve signals containing varying amounts of spurious content. Spurious (aka spurs) are basically defined as the random value whose variation differs from the standard error resulting from the following regression equations:

$$\sum_{n=1}^{N} y_i = bn + m \sum_{n=1}^{N} x_i$$

$$\sum_{n=1}^{N} x_i y_i = b \sum_{n=1}^{N} x_i + m \sum_{n=1}^{N} x_i$$

which are re-ordered to:

$$b = \frac{(\sum y_i - m \sum x_i)}{N}$$

$$m = \frac{(N \sum x_i y_i - \sum x_i \sum y_i)}{(N \sum x_i^2 - (\sum x_i)^2)}$$

substituting the following:

$$S_{xx} = N \sum x_i^2 - \left(\sum x_i\right)^2$$

$$S_{yy} = N \sum y_i^2 - \left(\sum y_i\right)^2$$

$$S_{xy} = N \sum x_i y_i - \sum x_i \sum y_i$$

results in:

$$m = \frac{S_{xy}}{S_{xx}}$$

and forms the equation:

$$y_i = b + mx + \epsilon_i$$

where $\epsilon_i$ is a normally distributed random variable with zero mean and common variance $\sigma^2$. The standard error is then defined as:

$$S_e^2 = \frac{1}{(N-2)} \sum (y_i - (b + mx_i))^2$$

Figure 7A:
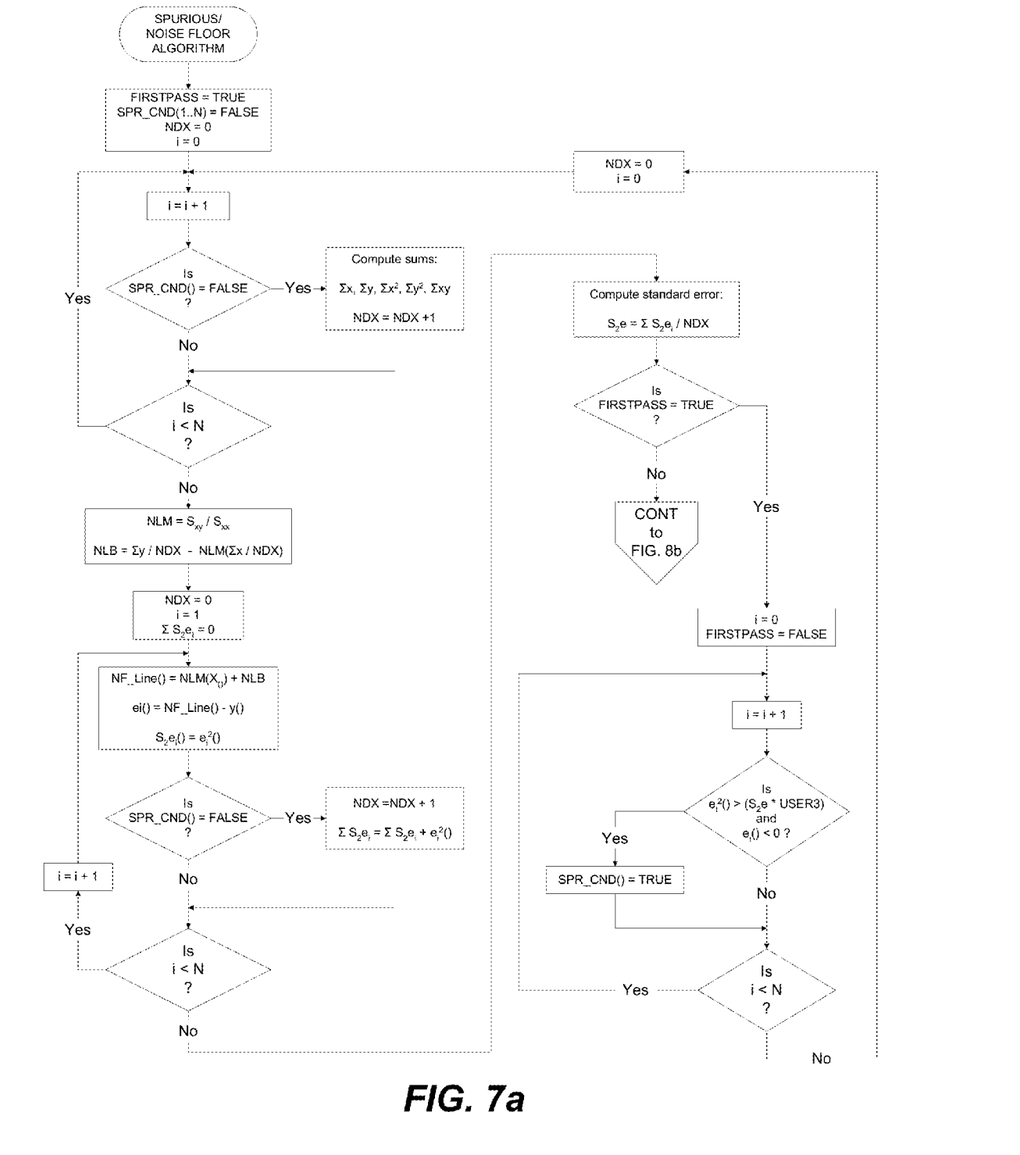
FIG. 7*a* and FIG. 7*b* detail a spurious/noise floor algorithm for use in the invention.
Figure 7B:
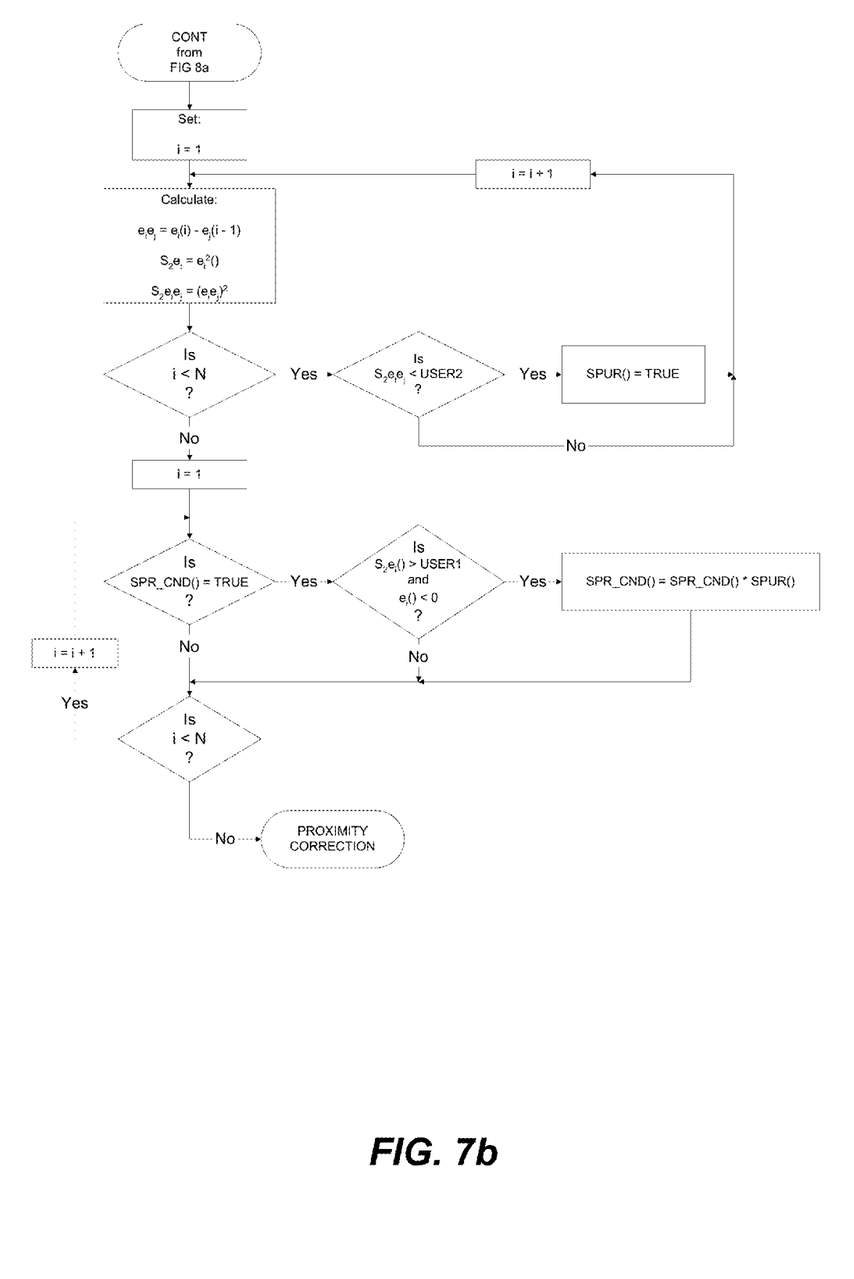

In a preferred embodiment, raw phase noise measurement data is analyzed for spurious content using regression/statistical algorithms through the use of the above equations applied in the algorithm shown in FIGS. 7a and 7b. Three user variables (USER1, USER2, USER3; each having a nominal value of 1) allow for adjustment under varying conditions of spurious content. An explanation of the manner in which the algorithm is executed is easily gleaned from the content of FIGS. 7a and 7b, which steps are based on the above equations. This algorithm is not limiting and other comparable or equivalent algorithms that achieve the same function of identifying spurious signals may be applied in the invention.

Figure 7C:
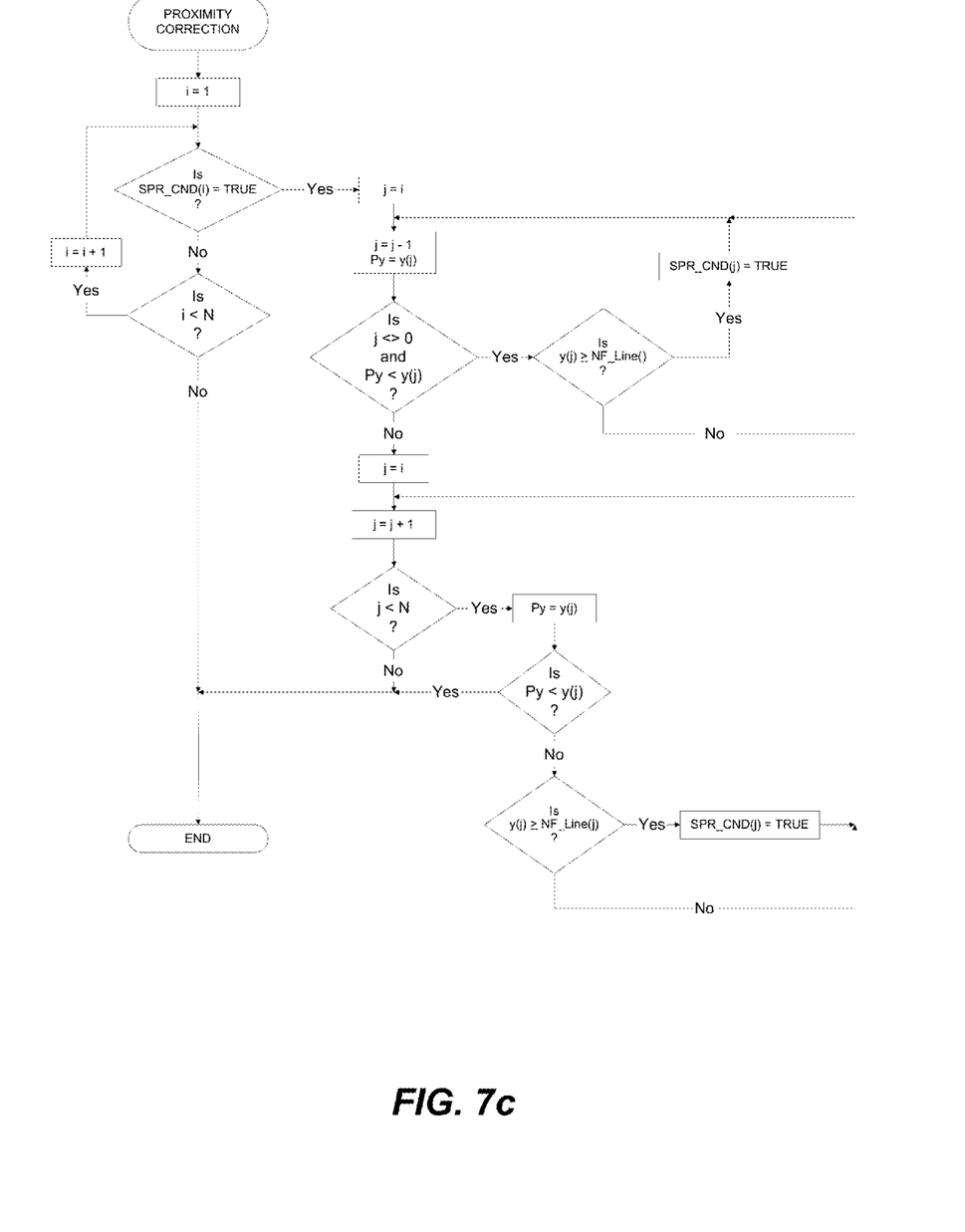
FIG. 7*c* outlines a proximity correction algorithm for identifying spurious in the data set for use in the invention.

Once the spurious signals have been identified, all points forming a spur by close proximity are excluded from limit line evaluation. FIG. 7c outlines the algorithm as to determining which points are excluded from evaluation. The excluded points are essentially the data points on the phase noise data curve identified as spurious which are above the noise floor (NF_Line) determined in the prior regression/statistical analysis. Points falling outside of the identified spurs are subject to the user limit lines established for the DUT 26. An explanation of the manner in which the algorithm in FIG. 7c is executed is easily gleaned from the content of FIG. 7c, which steps are based on the above equations. This algorithm is not limiting and other comparable or equivalent algorithms that achieve the same function of excluding points forming a spur by close proximity from limit line evaluation may be applied in the invention. In order to measure low phase noise, a stable low phase noise source is required on the 'Syn' input to the receiver 16. The invention includes a programmable synthesizer module (embodied as or within the low noise synthesizer 18) capable of producing a broad range of frequencies necessary for measuring additive and absolute phase noise. In order to achieve the lowest phase noise possible, a variety of different techniques including surface acoustic wave (SAW) oscillators, oven controlled crystal oscillators (OCXO) and a direct digital synthesizer (DDS) are employed. OCXO oscillators inherently have good phase noise at carrier frequency offsets of less than 100 kHz whereas SAW oscillators have good phase noise at carrier frequency offsets greater than 100 kHz. Since OCXO and SAW oscillators have fixed frequency outputs, the addition of a DDS element results in a low phase noise source with a programmable frequency when it is mixed with the OCXO or SAW oscillators.

Figure 8:
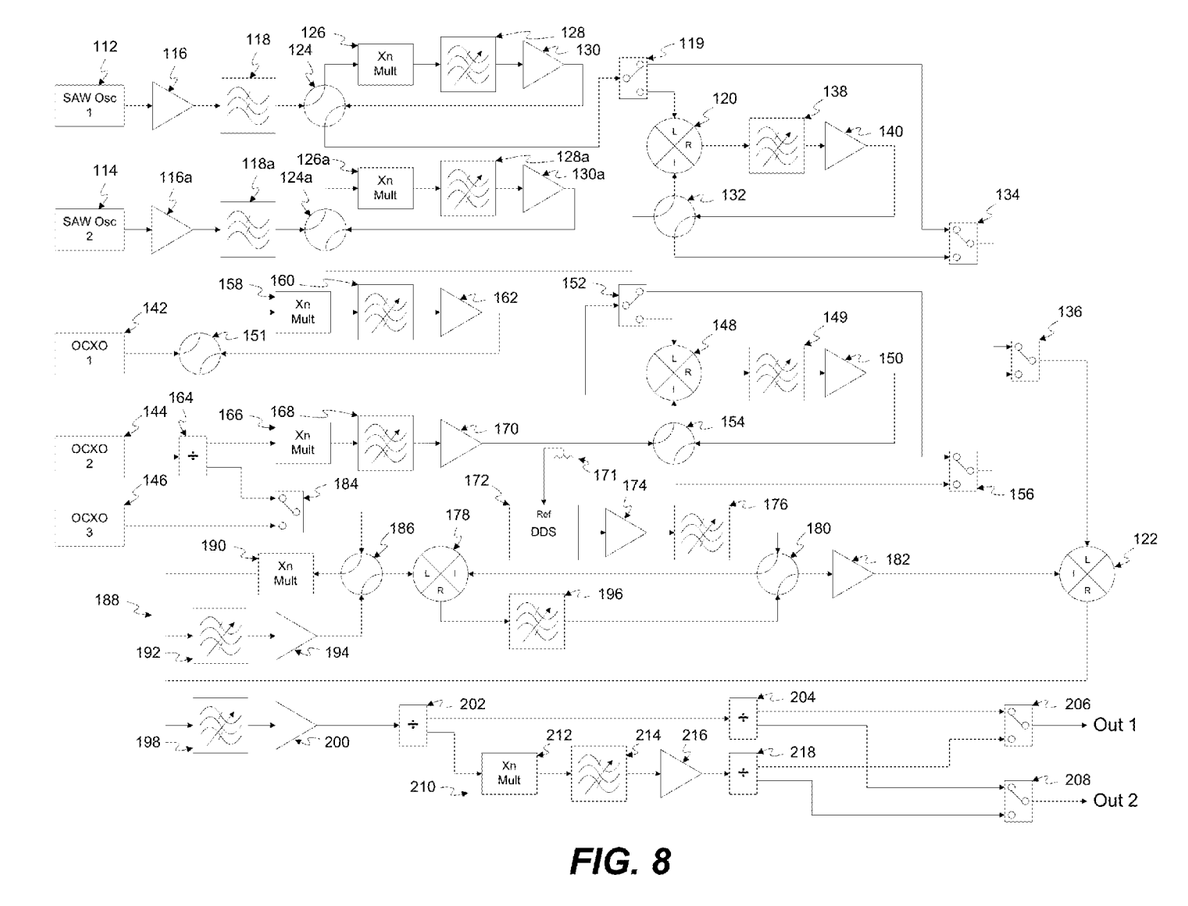
FIG. 8 reflects the synthesizer portion of the system in further detail.

Referring now to FIG. 8, the invention employs a plurality of surface acoustic wave (SAW) oscillators 112, 114 to generate signals with low phase noise at carrier frequency offsets greater than about 100 kHz. The first SAW oscillator 112, having a nominal fundamental frequency of about 960 MHz is amplified by amplifier 116 and low pass filtered by filter 118 and can directly feed the 'L' port of a mixer 120 via a switch 119 or the 'L' port of a mixer 122 depending on the setting of switch 119, as well as the settings of switches 134, 136. This signal may also be switched through a transfer switch 124 where a frequency multiplier or harmonic generator 126 multiplies the fundamental frequency in integer multiples (i.e. ×2, ×3, etc.) using step recovery diode (SRD), overdriven amplifier or similar means. It is assumed the practical upper frequency limit of any frequency multipliers discussed herein is nominally 20 GHz mainly due to cost constraints but this is not intended to be a limiting factor of the invention. After frequency multiplication, the signal is filtered using a tunable bandpass filter 128 to select the desired harmonic necessary and amplified by amplifier 130 before being applied to either mixer 120, 122.

In the embodiment shown in FIG. 8, the second SAW oscillator 114 having a nominal fundamental frequency of about 1090 MHz can directly feed the 'I' port of the mixer 120 through a switch 132 or the 'L' port of the mixer 122 through switches 132, 134, 136. The signal from the second SAW oscillator 114 can be subjected to the same processing as the signal from the first SAW oscillator 112, e.g., frequency multiplied and processed by components 116a, 118a, 124a, 126a, 128a, 130a comparable to respective components 116, 118, 124, 126, 128 and 130, and mixed with the first SAW oscillator chain with the resultant frequency appearing at the 'R' port of the mixer 120. In this arrangement, the resultant signal from mixer 120 is filtered using a tunable bandpass filter 138 to select the desired mixer product and amplified by amplifier 140 before being applied to mixer 122.

The invention also employs a plurality of oven controlled crystal oscillators (OCXO) 142, 144, 146 to generate signals with low phase noise at carrier frequency offsets less than about 100 kHz. The first OCXO 142, having a nominal fundamental frequency of about 100 MHz can directly feed the 'L' port of the mixer 148 through switches 151, 152 or the 'L' port of the mixer 122 through switches 151, 152, 156, 136. The OCXO 142 can be frequency multiplied in a fashion similar to the SAW oscillators so that higher frequencies can be applied to mixer 148 or mixer 122. This may be implemented by the transfer switch 151, leading to/from a frequency multiplier generator 158, a tunable bandpass filter 160 and an amplifier 162. The 'R' port of mixer 148 may be bandpass filtered by tunable filter 149 to select the desired mixer product, and then amplified by amplifier 150 before being applied to mixer 122 via switches 154, 156 and 136.

The second OCXO 144 in the embodiment shown in FIG. 8 is intended to operate a little differently. This OCXO 144, having a nominal fundamental frequency of about 120 MHz, provides a signal that passes through a power splitter 164; one side of the split is frequency multiplied by frequency multiplier 166 by default, filtered using a tunable bandpass filter 168 and amplified by amplifier 170 to select the desired harmonic necessary. In a preferred embodiment, this multiplication factor will be 8 resulting in a 960 MHz carrier frequency. This signal can directly feed the 'I' port of mixer 148 through switch 154 or the 'L' port of mixer 122 through switches 154, 156, 136. The multiplied carrier passes through an RF coupler 171 which is used to source the reference frequency to the DDS 172.

The DDS 172 is capable of operation from DC to nominally 40% of the reference frequency. The upper frequency limit is dictated by Nyquist sampling theory which, in this case, would be about 50% of the reference frequency. In a preferred embodiment, this upper frequency limit would be somewhere around about 400 MHz. The output produced by the DDS 172 is then amplified by amplifier 174 and filtered using a tunable bandpass filter 176 to reduce harmonic content. This signal can directly feed the 'I' port of mixer 178 via switch 180 or amplified by amplifier 182 and routed to the 'I' port of mixer 122.

The second side of the OCXO splitter 164 can directly feed the 'L' port of mixer 178 via switches 184, 186 or switched by switch 186 into another multiplier chain 188. The multiplier chain 188 includes a frequency multiplier 190, a tunable bandpass filter 192 and an amplifier 194.

In the embodiment shown in FIG. 8, the third OCXO 146, having a nominal frequency of about 160 MHz, may provide an output signal that can be routed to the multiplier chain 188 in lieu of the signal from the second OCXO 144. The resultant frequency appearing at the 'R' port of the mixer 178 is filtered using a tunable bandpass filter 196 to select the desired mixer product and amplified by amplifier 182 before being applied to mixer 122. Alternate embodiments may introduce interim connection points at any of SAW, OCXO and DDS stages using switches, splitters, couplers, etc. as user requirements dictate.

The signal produced at the 'R' port of mixer 122 is capable of being programmed to a broad range of frequencies through selection of the various multiplier factors, bandpass filter frequencies and the DDS. Phase noise performance can be tailored for low frequency offset phase noise performance by primarily using the OCXO-based sources (112, 114) or for higher frequency offset phase noise performance using the SAW oscillator-based sources (142, 144, 146). This signal is bandpass filtered by tunable filter 198 to select the desired mixer product and amplified by amplifier 200 before being applied to a splitter 202. The first leg from the splitter 202 is routed to a second splitter 204 which is capable of being routed to two outputs simultaneously via switches 206, 208. The second leg from the splitter 202 passes through a multiplier chain 210, including a frequency multiplier 212, tunable bandpass filter 214 and amplifier 216, and then to another splitter 218 which is also capable of being routed to same two outputs via switches 206, 208. These two outputs may consist of the fundamental output of mixer 122, a frequency multiplied version of the mixer output or combination of both. The following phase noise performance is achievable:

| Offset | L-Band | S-Band |
| --- | --- | --- |
| 100 Hz | −109 dBc/Hz | −99 dBc/Hz |
| 1 kHz | −133 dBc/Hz | −123 dBc/Hz |
| 10 kHz | −142 dBc/Hz | −132 dBc/Hz |
| 100 kHz | −151 dBc/Hz | −141 dBc/Hz |
| 500 kHz | −159 dBc/Hz | −149 dBc/Hz |
| 1 MHz | −159 dBc/Hz | −149 dBc/Hz |
| 2 MHz | −159 dBc/Hz | −149 dBc/Hz |

The flight line tester included in housing 8 is intended to test military radar systems or subassemblies thereof, i.e., which would be the device under test 26. In a broader sense, the tester is capable of testing RF sources (absolute phase noise) or other RF assemblies (additive phase noise). The device under test could be any of these, e.g., an RF source of an RF assembly.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. A phase noise analyzing system that analyzes phase noise in radio frequency (RF) signals provided by a device under test when coupled thereto, comprising:
 a low noise receiver that receives at a first input, signals from the device under test when coupled thereto, said receiver including a phase lock loop, and compensation means for compensating for a suppression effect induced on phase noise by the phase lock loop;
 a low noise synthesizer that provides output to said receiver;
 a frequency domain analyzer that receives output from said receiver;
 a time domain analyzer that receives output from said receiver;
 a switching system that controls signal flow to and from said receiver, said synthesizer, said frequency domain analyzer and said time domain analyzer; and
 a computer that controls said switching system to perform the analysis of phase noise in signals provided by the device under test.

2. The system of claim 1, wherein said computer is a portable computer, further comprising a transportable housing having a first port for connecting to the computer and a second port for connecting to the device under test, said receiver, said synthesizer, said frequency domain analyzer and said time domain analyzer being situated in or on said housing such that said system is transportable.

3. The system of claim 2, further comprising at least one power supply arranged in or on said housing and coupled to said receiver, said synthesizer, said frequency domain analyzer and said time domain analyzer to provide power to said receiver, said synthesizer, said frequency domain analyzer and said time domain analyzer.

4. The system of claim 1, further comprising at least one power supply arranged in or on said housing, said at least one power supply being configured to provide power to the device under test when coupled thereto.

5. A phase noise analyzing system that analyzes phase noise in radio frequency (RF) signals provided by a device under test when coupled thereto, comprising:
 a low noise receiver that receives signals from the device under test when coupled thereto;
 a low noise synthesizer that provides output to said receiver;
 a frequency domain analyzer that receives output from said receiver;
 a time domain analyzer that receives output from said receiver;
 a switching system that controls signal flow to and from said receiver, said synthesizer, said frequency domain analyzer and said time domain analyzer; and
 a computer that controls said switching system to perform the analysis of phase noise in signals provided by the device under test,
 said receiver comprising a level conditioning stage in which an input signal is conditioned, said level conditioning stage including at least one of a programmable attenuator controlled by said computer and a low noise amplifier, said receiver further comprising a first switching system that selectively directs an input signal to said level conditioning stage or directly to said frequency domain analyzer.

6. The system of claim 5, wherein said receiver further comprises:
 band-dependent phase shifters;
 a first mixer;
 a second switching system that selectively switches a signal from one of said band-dependent phase shifters to an R port of said first mixer, said first mixer having a L port receiving input from said synthesizer, said first mixer providing an output of a baseband (BB) signal containing DC+noise; and
 a filtering stage interposed between said first mixer and said time domain analyzer for filtering the BB signal.

7. The system of claim 6, wherein said one of said band-dependent phase shifters is controlled to find settings at which the DC component of the BB signal exhibits a maximum excursion as well as the minimum.

8. The system of claim 6, further comprising a DC block interposed between said filtering stage and said frequency domain analyzer to remove a residual DC component of the BB signal.

9. The system of claim 6, wherein said receiver further comprises at least one low noise amplifier and a third switching system that selectively switches the BB signal into a path of each of said at least one low noise amplifiers.

10. The system of claim 9, wherein said at least one low noise amplifier comprises first and second low noise amplifiers, and said third switching system comprises a first switch that selectively switches a signal through said first low noise amplifier and a second switch that selectively switches a signal through said second low noise amplifier independent of said first switch.

11. The system of claim 9, wherein said receiver further comprises a tunable highpass filter for spurious reduction of the BB signal and a fourth switching system that selectively switches the BB signal into a path of said highpass filter.

12. The system of claim 6, wherein said receiver further comprises:
 a signal splitter that splits the BB signal into first and second components;
 a second mixer that receives the first component at an R port; and
 a phase lock loop voltage controlled crystal oscillator that processes the second component and provides the processed signal component to the L port of said second mixer, said second mixer providing an output of a baseband (BB) signal containing DC+noise.

13. The system of claim 12, further comprising a bandpass filter that filters the BB signal prior to said signal splitter, and an amplifier that amplifiers the filtered BB signal prior to said signal splitter.

14. The system of claim 12, further comprising a low pass filter that filters the BB signal output from said second mixer, the filtered BB signal being provided to said time domain analyzer.

15. The system of claim 1, wherein said receiver further comprises a downconversion stage including a mixer that receives a signal from the device under test at an R port via a second input and a signal from said synthesizer at an L port, a bandpass filter that filters an downconverted output from the I port of said mixer, an amplifier that amplifies the filtered downconverted output, the amplified signal being provided to the first input of said receiver.

16. A phase noise analyzing system that analyzes phase noise in radio frequency (RF) signals provided by a device under test when coupled thereto, comprising:
  a low noise receiver that receives signals from the device under test when coupled thereto;
  a low noise synthesizer that provides output to said receiver;
  a frequency domain analyzer that receives output from said receiver;
  a time domain analyzer that receives output from said receiver;
  a switching system that controls signal flow to and from said receiver, said synthesizer, said frequency domain analyzer and said time domain analyzer; and
  a computer that controls said switching system to perform the analysis of phase noise in signals provided by the device under test,
  said synthesizer comprising:
    first and second surface acoustic wave (SAW) oscillators that generate signals with low phase noise at carrier frequency offsets greater than about 100 kHz;
    a first mixer that receives signals originating from said first SAW oscillator at an L port and signals originating from said second SAW oscillator at an I port;
    a second mixer that receives at an L port a signal output from said first mixer;
    a first oven controlled crystal oscillator that generates signals with low phase noise at carrier frequency offsets less than about 100 kHz;
    a third mixer that receives at an L port a signal output from said first oven controlled crystal oscillator;
    a first switching system that selectively routes the signal output from said first mixer or a signal originating from said a first oven controlled crystal oscillator to the L port of said second mixer;
    a second oven controlled crystal oscillator that generates signals with low phase noise at carrier frequency offsets of about 120 MHz;
    a signal splitter that splits a signal output from said second oven controlled crystal oscillator into first and second components;
    a first frequency multiplier and processing stage that acts on said first component;
    a second switching system that selectively routes the signal output from said first frequency multiplier and processing stage to an I port of said third mixer or to the L port of said second mixer;
    a second frequency multiplier and processing stage that acts on said second component;
    a fourth mixer;
    a third switching system that selectively routes the second component or the signal output from said second frequency multiplier and processing stage to an L port of said fourth mixer;
    a direct digital synthesizer for originating a signal to be provided to an I port of said fourth mixer;
    a third oven controlled crystal oscillator that generates signals with low phase noise at carrier frequency offsets of about 160 MHz, said third switching system being configured to selectively route the signal from said third oven controlled voltage oscillator directly to or indirectly after passing through said second frequency multiplier and processing stage to the L port of said fourth mixer; and
    a fourth switching system that selectively routes the signal originating from said first digital synthesizer to an I port of said second mixer or a signal originating at an outlet, R port of said fourth mixer.

17. The system of claim 16, wherein said synthesizer further comprises a third signal multiplier and processing stage that receives a signal output from an R port of said second mixer and generates two different outputs based on this signal.

18. A method for analyzing phase noise in signals provided by a device under test, comprising:
  measuring phase noise of a signal from the device under test;
  setting, using a processor, an initial corrected value for points in the signal to a value (MV) of the measured phase noise and a counter to 1; then
  computing, using the processor or an additional processor, a corrected value (CV) for each point based on the equation $$CV = MV - 10 * \log_{10}\left(1 + 10^{-ABS\left[\frac{REF-CV}{10}\right]}\right)$$

wherein REF is a level of a reference carrier of the low noise synthesizer;
  determining for each point, using the processor or an additional processor, whether a change between the corrected value and an immediately preceding corrected value is below a threshold or whether the counter is greater than a predetermined number and if so, using the corrected value as an indication of the phase noise of the signal, otherwise incrementing the counter and re-computing the corrected value until the change between the corrected value and an immediately preceding corrected value is below the threshold or the counter is greater than the predetermined number; and
  displaying on a display, the phase noise of the signal.

19. A method for analyzing phase noise in signals provided by a device under test, comprising:
  measuring phase noise of a signal from the device under test using a receiver having a phase lock loop;
  compensating for a suppression effect induced on the measured phase noise by the phase lock loop by:
    for an offset frequency range of the signal, determining a polynomial line that best fits points of the signal in the frequency range using a processor; and
    adjusting, using the processor or an additional processor, the measured phase noise by the polynomial fit line to correct for the suppression effect induced by the phase lock loop; and
  displaying on a display, the measured phase noise after compensation for the induced suppression effect.

20. A method for analyzing phase noise in signals provided by a device under test, comprising:
  measuring phase noise of a signal from the device under test using a receiver having a phase lock loop;
  identifying spurious signals in the measured phase noise using a processor;
  compensating for a suppression effect induced on measured phase noise by the phase lock loop by excluding, using the processor or an additional processor, points forming a spur in the identified spurious signals by close proximity from limit line evaluation by comparing the points to a limit relating to the device under test; and displaying on a display, the measured phase noise after compensation for the induced suppression effect.

21. The method of claim 20, wherein the step of identifying spurious signals using a processor comprises identifying data points on a phase noise data curve above a noise floor determined in a preceding regression/statistical analysis.

22. The system of claim 5, wherein said receiver includes a phase lock loop, and compensation means for compensating for a suppression effect induced on phase noise by the phase lock loop.

23. The system of claim 16, wherein said receiver includes a phase lock loop, and compensation means for compensating for a suppression effect induced on phase noise by the phase lock loop.

* * * * *